United States Patent [19]
Axel et al.

[11] Patent Number: 5,111,820
[45] Date of Patent: May 12, 1992

[54] SYSTEM AND METHOD FOR MAGNETIC RESONANCE IMAGING OF 3-DIMENSIONAL HEART WALL MOTION WITH SPATIAL MODULATION OF MAGNETIZATION

[75] Inventors: Leon Axel, Philadelphia, Pa.; Lawrence Dougherty, Wenonah, N.J.

[73] Assignee: The Trustees of the University of Pennsylvania, Philadelphia, Pa.

[21] Appl. No.: 608,209

[22] Filed: Nov. 2, 1990

[51] Int. Cl.⁵ .............................................. A61B 5/055
[52] U.S. Cl. .................... 128/653 A; 324/309
[58] Field of Search ..................... 128/653 A; 324/309

[56] References Cited

U.S. PATENT DOCUMENTS 4,752,734 6/1988 Wedeen .............................. 324/306

OTHER PUBLICATIONS

Axel et al., "Heart Wall Motion: Improved Method of Spatial Modulation of Magnetization for MR Imaging", *Radiology*, vol. 172, Aug. 1989, pp. 349–350.
Axel et al., "MR Imaging of Motion with Spatial Modulation of Magnetization", *Radiology*, vol. 171, Jun. 1989, pp. 841–845.
Fenton et al., "Transmural Myocardial Deformation in the Canine Left Ventricular Wall", *American Journal of Physiology*, vol. 235, 1978, pp. H523–H530.
Hore, "Solvent Suppression in Fourier Transform Nuclear Magnetic Resonance", *Journal of Magnetic Resonance*, vol. 55, 1983, pp. 283–300.
Meier et al., "Kinematics of the Beating Heart", *IEEE Transactions on Biomedical Engineering*, vol. 27, No. 6, Jun. 1980, pp. 319–329.
Meier et al., "Contractile Function in Canine Right Ventricle", *American Journal of Physiology*, vol. 239, 1980, pp. H794–H804.
Nayler et al., "Blood Flow Imaging by Cine Magnetic Resonance", *Journal of Computer Assisted Tomography*, vol. 10, Sep./Oct. 1986, pp. 715–722.
P. van Dijk, "Direct Cardiac NMR Imaging of Heart Wall and Blood Flow Velocity", *Journal of Computer Assisted Tomography*, vol. 8, Jun. 1984, pp. 429–436.
Waldman et al., "Transmural Myocardial Deformation in the Canine Left Ventricle", *Circulation Research*, vol. 57, 1985, pp. 152–163.
Zerhouni et al., "Human Heart: Tagging with MRI Imaging–A Method for Noninvasive Assessment of Myocardial Motion", *Radiology*, vol. 169, 1988, pp. 59–63.
T. J. Mosher et al., A Dante Tagging Sequence for the Evaluation of Translation Sample Motion; *Magnetic Resonance in Medicine*, vol. 15, 1990, pp. 334–339.

*Primary Examiner*—Ruth S. Smith
*Attorney, Agent, or Firm*—Woodcock Washburn Kurtz Mackiewicz & Norris

[57] ABSTRACT

Spatial Modulation of Magnetization (SPAMM) with two sets of tagging planes orthogonal to the image plane is used in accordance with known techniques to image two-dimensional heart wall motion with MRI. However, such techniques are modified in accordance with the invention to permit direct assessment of three-dimensional heart wall motion from two-dimensional images using a three-dimensional SPAMM technique and a phase shift SPAMM technique. The three-dimensional SPAMM technique uses a third set of tagging planes oblique to the image plane to separate within-plane motion from through-plane motion. In accordance with the 3-dimensional SPAMM technique, the displacement of the oblique magnetization lines relative to the displacement of the spatial modulation pattern in the imaging plane during a preimaging time interval is indicative of the displacement of a body portion such as a patient's heart wall through the imaging plane during the preimaging time interval. Preferably, the oblique angle is 45° so that the amount of stripe displacement is equal to the amount of through-plane-motion. On the other hand, the phase-shift SPAMM technique encodes through-plane velocity as a corresponding phase shift. An integral may then be taken of the resulting phase-sensitized images in order to determine the through-plane displacement corresponding to the phase shift. Both techniques in accordance with the invention allow three-dimensional images of internal body tissues such as the heart wall to be imaged with minimal image acquisition and interpolation time.

16 Claims, 6 Drawing Sheets

SYSTEM AND METHOD FOR MAGNETIC
RESONANCE IMAGING OF 3-DIMENSIONAL
HEART WALL MOTION WITH SPATIAL
MODULATION OF MAGNETIZATION

CROSS-REFERENCE TO RELATED APPLICATIONS

This application is related to co-pending Pat. application Ser. No. 07/254,454, filed by Axel et al. on Oct. 6, 1988 and entitled "Improved Methods of Magnetic Resonance Imaging", now U.S. Pat. No. 5,054,489 and to co-pending patent application Ser. No. 07/570,207, filed by Axel on Aug. 17, 1990 and entitled "System and Method for Analyzing Heart Wall Motion Using Tagged Magnetic Resonance Images", the contents of both of which are hereby incorporated by reference as if set forth herein in their entireties.

BACKGROUND OF THE INVENTION

1. Field of the Invention

The present invention relates to a system and method for magnetic resonance (MR) imaging of heart wall motion in three dimensions using Spatial Modulation of Magnetization (SPAMM), and more particularly, to a system and method which permits direct assessment of three-dimensional heart wall motion from two-dimensional MR images.

2. Description of the Prior Art

As described in the afore-mentioned related patent applications, Spatial Modulation of Magnetization (SPAMM) creates multiple parallel "planes" or sheets of altered magnetization with easily controlled spacing and orientation. When used in conjunction with conventional magnetic resonance imaging (MRI), the intersection of these planes of altered magnetization with an image plane creates tagging stripes in the image that move with the underlying tissue in a similar manner as stripes created by selective saturation techniques do. Such selective saturation techniques are described by Zerhouni et al. in an article entitled "Human Heart: Tagging With MR Imaging—A Method For Noninvasive Assessment of Myocardial Motion", *Radiology*, Vol. 169, 1988, pp. 59-74. Also, when used in conjunction with cardiac-synchronized MR imaging of the heart with application of SPAMM at one phase of the cardiac cycle and imaging at a later phase, the stripe displacement in the image of the heart wall reflects the corresponding motion of the underlying wall between the times of SPAMM application and subsequent imaging.

SPAMM has been previously used to create two mutually orthogonal sets of planes of saturated magnetization, both orthogonal to the imaging plane, to produce a grid of tagging stripes in the image that can be used to track in-plane heart wall motion. However, in general, the motion of the heart includes a third dimension of motion, i.e., the motion through the imaging plane. One way to find the through-plane component of motion has been to acquire a second set of SPAMM tagged images which is oriented perpendicular to the first set. However, such a technique necessitates twice as much total image acquisition time and interpolation between the two image sets. A faster and simpler approach is desired for acquiring three-dimensional images of heart wall motion.

Accordingly, it is desired to develop alternative approaches to heart wall motion imaging with modified SPAMM sequences which can provide full three-dimensional motion information without the image acquisition and interpolation delays of existing techniques. Preferably, such approaches will allow for the provision of full three-dimensional motion information from a single set of two-dimensional tagged images so as to minimize acquisition and interpolation time. The present invention has been designed to meet this need.

SUMMARY OF THE INVENTION

As noted above, SPAMM produces parallel planes of altered magnetization which intersect the imaging plane and produce tagging stripes that move with the heart wall. Two sets of tagging planes perpendicular to the imaging plane produce a grid of stripes that can be used to follow in-plane motion. The present invention relates to a technique for assessing through-plane motion. This is accomplished in accordance with the invention either by applying a third set of tagging planes, inclined at an oblique angle to the others, so that the intersection of these tagging planes with the imaging plane will form a third set of stripes that will move relative to the others with through-plane motion, or by encoding the through-plane velocity as a corresponding phase shift which may be integrated to determine displacement.

The apparatus of the invention may be incorporated into existing MR imaging devices by way of a unit specially designed for this purpose, or a computer program may be implemented to provide the necessary displacement determinations in accordance with the method of the invention and to produce a visual display of the results. The applications include, but are not limited to, analysis of heart wall motion as described herein or analysis of motion of the patient's blood or motion of the patient's cerebrospinal fluid.

The novel advantages, features and objects of the present invention are realized by a method of magnetic resonance imaging the body portion of a patient by performing the steps of:

applying to the body portion an external magnetic field so as to produce a resultant magnetization;

applying a pre-imaging sequence to the body portion so as to spatially modulate transverse and longitudinal components of the resultant magnetization, thereby producing a spatial modulation pattern in an imaging plane;

applying an imaging sequence to the body portion;

determining a displacement of the modulation pattern through the imaging plane in a direction substantially perpendicular to the imaging plane during a pre-imaging time interval between the times of application of the pre-imaging and imaging sequences; and providing an image representing magnetic resonance signals having the spatial modulation pattern and displacement through the imaging plane as emitted from the patient.

In a preferred embodiment of the invention, the body portion is the patient's heart wall, although the body portion may also be the patient's blood or the patient's cerebrospinal fluid.

The method of the invention may be accomplished in accordance with at least two different embodiments of the invention. In a first embodiment of the invention, the pre-imaging sequence applying step comprises the step of modulating the resultant magnetization to produce oblique magnetization lines in the body portion which are oriented at an oblique angle to the imaging plane. In accordance with this method, the determining step comprises the step of determining a displacement of the oblique magnetization lines relative to a displacement of the spatial modulation pattern of orthogonal magnetization lines in the imaging plane during the pre-imaging time interval, whereby a relative displacement indicates a displacement of the body portion through the imaging plane during the pre-imaging time interval. In accordance with the first embodiment, the oblique angle is preferably 45°. By contrast, in a second embodiment of the invention, the pre-imaging sequence applying step comprises the step of encoding motion through the imaging plane during the pre-imaging time interval as motion-induced phase shifts caused by motion of excited nuclear spins along gradients of the resultant magnetization, thereby producing a phase-sensitized modulation pattern in the imaging plane. In accordance with the latter embodiment, the determining step comprises the step of integrating the phase-sensitized modulation pattern to get a signal indicative of a displacement of the body portion through the imaging plane during the pre-imaging time interval.

The invention further comprises apparatus for performing the above-mentioned method in accordance with the invention. Preferably, such an apparatus for magnetic resonance imaging a body portion of a patient comprises:

means for applying to the body portion an external magnetic field so as to produce a resultant magnetization;

imaging means for applying a pre-imaging sequence to the body portion so as to spatially modulate transverse and longitudinal components of the resultant magnetization, thereby producing a spatial modulation pattern in an imaging plane, and for applying an imaging sequence to the body portion;

means for determining a displacement of the modulation pattern through the imaging plane in a direction substantially perpendicular to the imaging plane during a pre-imaging time interval between the times of application of the pre-imaging and imaging sequences; and a display for displaying an image representing magnetic resonance signals having the spatial modulation pattern and the displacement through the imaging plane as emitted from the patient.

As with the method of the invention, the body portion is preferably the patient's heart wall, the patient's blood or the patient's cerebrospinal fluid.

The advantages of the invention may be realized in accordance with at least two preferred embodiments of the apparatus of the invention. In a first embodiment, the imaging means comprises means for modulating the resultant magnetization to produce oblique magnetization lines in the body portion which are oriented at an oblique angle to the imaging plane. Preferably, the oblique angle is on the order of 45°. In this embodiment, the determining means comprises means for determining a displacement of the oblique magnetization lines relative to a displacement of the spatial modulation pattern of orthogonal magnetization lines in the imaging plane during the pre-imaging time interval, the relative displacement indicating a displacement of the body portion through the imaging plane during the pre-imaging time interval. A second embodiment of the invention, on the other hand, includes imaging means comprising means for encoding motion through the imaging plane during the pre-imaging time interval as motion-induced phase shifts caused by motion of excited nuclear spins along gradients of the resultant magnetization, thereby producing a phase-sensitized modulation pattern in the imaging plane. Preferably, the determining means of the second embodiment further comprises means for integrating the phase-sensitized modulation pattern to get a signal indicative of a displacement of the body portion through the imaging plane during the pre-imaging time interval.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PRESENTLY PREFERRED EMBODIMENTS

Figure 1:
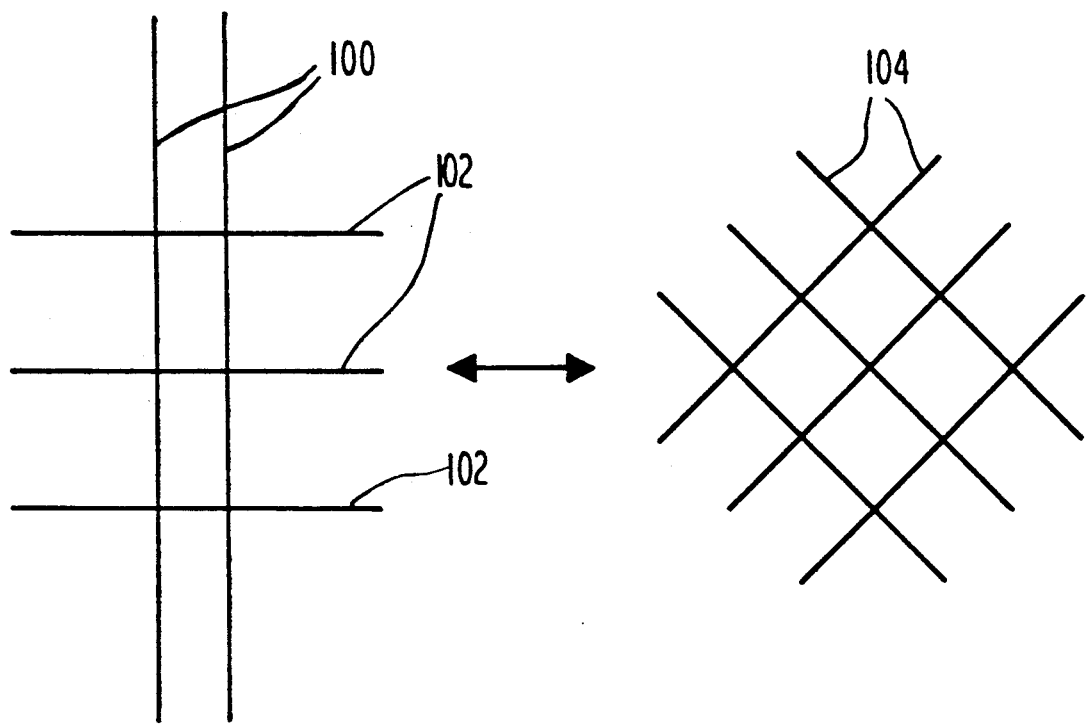
FIG. 1 is a schematic representation of tagging stripes in which SPAMM is used to create "sheets" of altered magnetization orthogonal to the image plane.

A method and system in accordance with presently preferred exemplary embodiments of the invention will be described below with reference to FIGS. 1-7. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

As described in the afore-mentioned related Pat. application Ser. No. 07/254,454, filed Oct. 6, 1988, the SPAMM technique uses a three pulse sequence consisting of two non-selective RF excitation pulses separated by a magnetic field gradient pulse. The sequence is then followed after a predetermined delay by a conventional imaging sequence. The first RF pulse produces transverse magnetization which is initially phase synchronized. The first RF pulse is followed by a gradient pulse which produces a regular variation of the phase of the excitated spins along the direction of the gradient, with a wavelength inversely proportional to the integral of the gradient pulse amplitude. The second RF pulse turns some of the phase-modulated transverse magnetization back into longitudinal magnetization with a corresponding modulation. The modulation takes the form of a sinusoidal dependence of the longitudinal magnetization on position along the direction of the modulating gradient. The amplitude of the modulation depends on the strength of the RF pulses. For example, two 45° pulses will produce modulation between the extremes of saturation and full magnetization. Longitudinal relaxation between the SPAMM and imaging sequences reduces the amplitude of the modulation. In the subsequent imaging sequence, the modulated longitudinal magnetization results in a corresponding intensity modulation in the final image, appearing as regularly spaced stripes perpendicular to the direction of the modulating gradient. Then, since the magnetization of any material moves as the material moves, any motion of the material between the time of the initial SPAMM sequence and the subsequent imaging sequence will be reflected in the corresponding displacement of the stripes in the final image. Other more optimal pulse sequences may also be used in accordance with the SPAMM technique. For example, binomial pulse sequences are discussed by Axel et al. in an article entitled "Heart Wall Motion: Improved Method of Spatial Modulation of Magnetization for MR Imaging", *Radiology*, Vol. 172, Aug. 1989, pp. 349-350. More details concerning SPAMM imaging can be found in the afore-mentioned related applications, which have previously been incorporated herein by reference.

In short, a two-dimensional array of stripes may be used to form a tagging grid by following the initial SPAMM sequence with a second one having a gradient oriented in an appropriate new direction. To avoid producing artifacts from stimulated echo formation, the phase of the RF pulse is preferably shifted by 90° between the two sequences. For effective composite flip angles other than 90°, the degree of saturation in the stripe intersections may differ from that in the stripes. When so used to create planes of altered magnetization orthogonal to the imaging plane, SPAMM will result in stripes in the image whose width and spacing directly reflect the width and spacing of the regions of altered magnetization as shown in FIG. 1.

On the left hand side of FIG. 1, the two vertical lines 100 denote the image slice as seen from the side and the horizontal lines 102 represent a set of SPAMM regions intersecting the slice. The right hand side of FIG. 1 shows a view into the slice whereby the intersection of the SPAMM regions with the image plane is used to create a two-dimensional grid of diagonal stripes 104 in the image. In such a case, pure through-plane motion does not produce any displacement of the stripes in the image, while pure in-plane motion will produce exactly corresponding stripe displacement.

Figure 2:
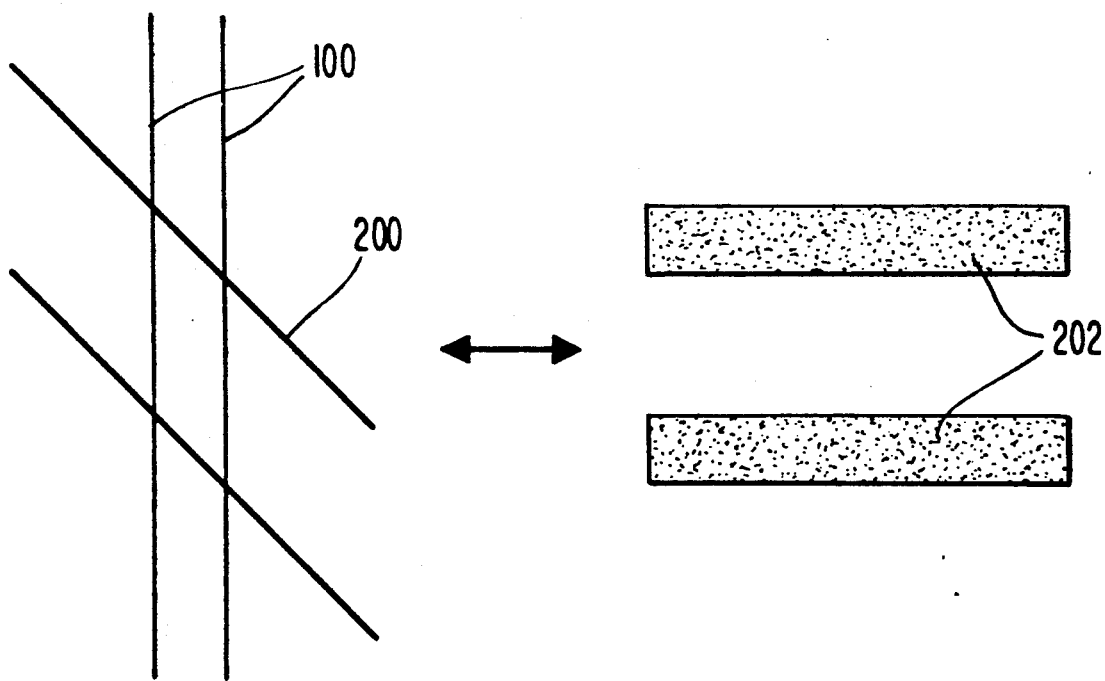
FIG. 2 is a schematic representation of tagging stripes with oblique SPAMM regions in accordance with the invention.

On the other hand, if the SPAMM regions are oriented at an oblique angle to the imaging plane, the resulting tagging stripes in the image will have a thickness that reflects the slice thickness and the angle of obliquity as well as the width of the SPAMM regions. The spacing of the stripes will also depend on the angle of obliquity as shown in FIG. 2. In FIG. 2, the vertical lines 100 on the left are the same as those shown in FIG. 1; however, the oblique lines 200 represent the SPAMM regions. On the right hand side of FIG. 2, in a corresponding image with oblique SPAMM regions used to create horizontal stripes, the stripes 202 are seen to be wider and less well defined than with similar orthogonal SPAMM regions of the type shown in FIG. 1. In this case, pure in-plane motion will produce a corresponding image stripe displacement, as with orthogonal SPAMM regions, but pure through-plane motion will also produce image stripe displacement as shown in FIG. 3.

Figure 3:
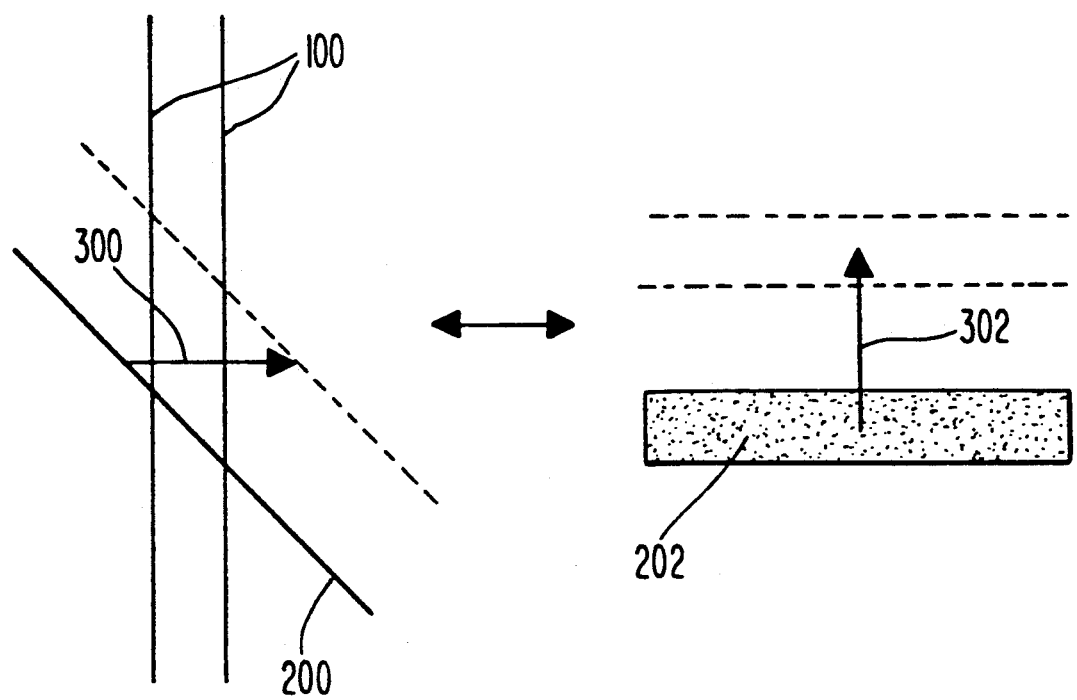
FIG. 3 is a schematic representation of pure through-plane motion of oblique SPAMM regions of the invention.

FIG. 3 illustrates the effect of pure through-plane motion of oblique SPAMM regions. On the left hand side of FIG. 3, the oblique SPAMM region of FIG. 2 moves through the imaging plane, as symbolized by the horizontal arrow 300. The resulting change in the intersection of the SPAMM region with the imaging plane results in displacement of the stripe 202 in the image as symbolized by the vertical arrow 302 on the right hand side of FIG. 3. The ratio of the amount of such stripe displacement to the amount of through-plane motion producing it will depend on the tangent of the angle of obliquity of the SPAMM regions. Since the amount of stripe displacement is equal to the amount of through-plane motion producing it when the angle of obliquity is 45° (i.e., the tangent of the angle of obliquity of the SPAMM regions equals one), a preferred angle of obliquity is approximately 45°.

Accordingly, by using SPAMM to create three sets of tagging planes, two orthogonal to the imaging plane and one oblique to it, their combined displacements may be used to find both the through-plane and the in-plane components of the motion between the time of application of the tags and subsequent imaging. The motion of the stripes produced by the orthogonal tagging planes will reflect only the in-plane motion, but will yield it directly. The motion of the stripes produced by the oblique tagging planes, on the other hand, will reflect both the through-plane and the in-plane motion, and by itself would not allow them to be separated. However, the orthogonal stripes may be used to provide a deforming reference system that incorporates the in-plane motion whereby the motion of the oblique stripes relative to the orthogonal stripes provides a direct measure of the through-plane motion. If the motion of the oblique stripe during the time interval between the pre-imaging and the imaging sequences is greater than the spacing between the orthogonal stripes, an ambiguity could result as to the amount of displacement as a result of "aliasing". Such a problem may be prevented by acquiring an intermediate image at a time when the displacement is smaller. In other words, less time should be taken between the pre-imaging sequence and the imaging sequence so that less movement occurs between the time of application of the pre-imaging and the imaging sequences.

Figure 4A:
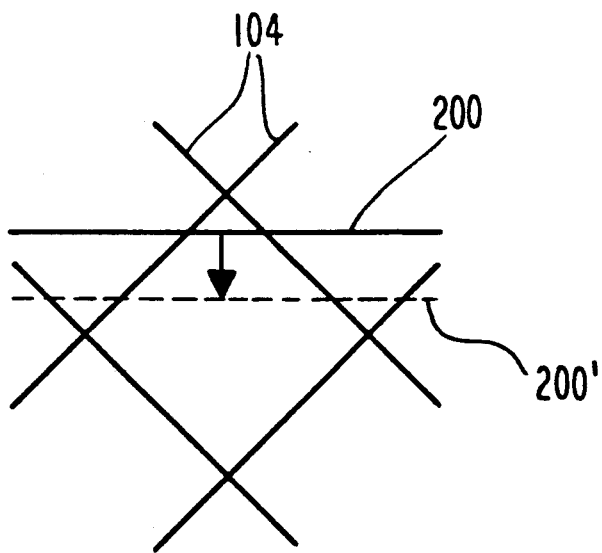
FIG. 4(A) is a schematic representation of the motion of image stripes produced by two sets of SPAMM tagging planes orthogonal to the image plane and one set of SPAMM tagging planes oblique to the image plane whereby pure through-plane motion is shown as motion of only the oblique stripes in the image.
Figure 4B:
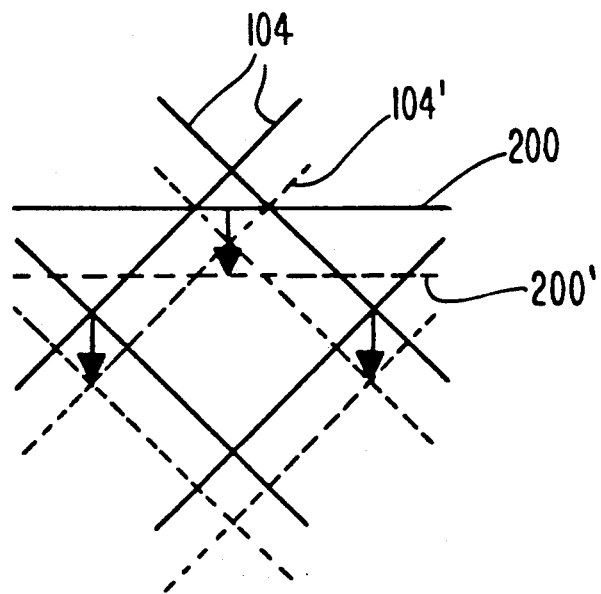
FIG. 4(B) is a schematic representation of the motion of image stripes produced by two sets of SPAMM tagging planes orthogonal to the image plane and one set of SPAMM tagging planes oblique to the image plane whereby pure in-plane motion is shown as producing motion of the oblique stripes together with the orthogonal stripes in the image.
Figure 4C:
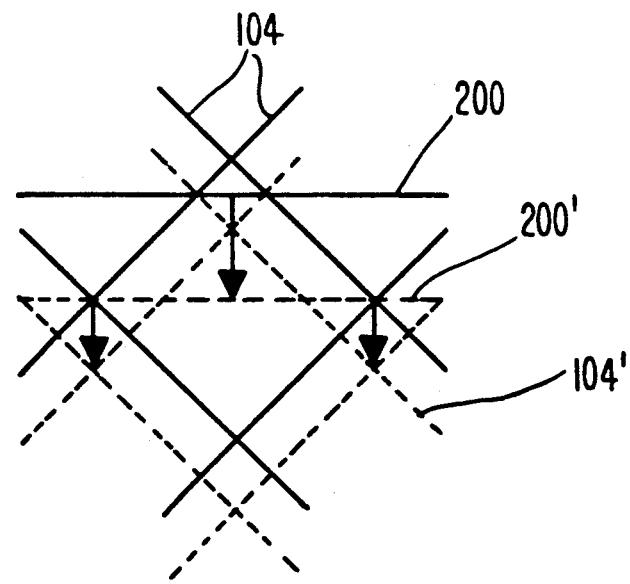
FIG. 4(C) is a schematic representation of the motion of image stripes produced by two sets of SPAMM tagging planes orthogonal to the image plane and one set of SPAMM tagging planes oblique to the image plane whereby combined in-plane and through-plane motion is shown as resulting in motion of the oblique stripes relative to the orthogonal stripes in the image.

FIGS. 4(A)-(C) illustrate the effects of different kinds of motion on image stripes produced by three sets of SPAMM tagging planes, where two sets of SPAMM tagging planes are orthogonal to the image plane (producing diagonal stripes in FIGS. 4(A)-(C)) and one set of SPAMM tagging planes is oblique to the imaging plane (producing horizontal stripes in FIGS. 4(A)-(C)). FIG. 4(A) illustrates pure through-plane motion whereby motion of only the oblique stripes 200 to position 200' is illustrated in the image. FIG. 4(B), on the other hand, illustrates pure in-plane motion whereby motion of the oblique stripes from 200 to 200' is of approximately the same displacement as the motion of the orthogonal stripes from 104 to 104'. In other words, the amount of displacement of the oblique stripes 200 is approximately equivalent to the displacement of the orthogonal stripes 104 for pure in-plane motion. By contrast, FIG. 4(C) illustrates combined in-plane and through-plane motion whereby the oblique stripes 200 to 200' move relative to the orthogonal stripes 104 to 104'.

Thus, when a series of images of different phases of the heart cycle is acquired after tagging with SPAMM at one initial phase in accordance with the invention, the initially orthogonal and specific angle oblique sheets of altered magnetization will be progressively deformed into other orientations by the motion of the heart. However, the procedures outlined above and illustrated in FIGS. 4(A)-(C) can still be used to unambiguously define the total three-dimensional motion at a given phase relative to the initial reference state configuration of the heart at the time of the initial application of the SPAMM tagging sequence. Interval motion between two different subsequent imaged cardiac phases then can be found from the differences in their configurations relative to this common reference state.

An alternative method in accordance with the invention for illustrating through-plane motion may also be implemented by directly encoding the three-dimensional motion information into a two-dimensional image by using the orthogonal SPAMM tagging planes to encode the in-plane motion and to encode through-plane motion as phase shifts. The use of motion-induced phase shifts (caused by motion of excited spins along magnetic field gradients) has previously been described as a means of imaging cardiac wall motion by van Dijk in an article entitled "Direct Cardiac NMR Imaging of Heart Wall and Blood Flow Velocity", *Journal of Computer Assisted Tomography*, Vol. 8, 1984, pp. 429-436. In other words, this embodiment of the invention uses motion-induced phase shift in conjunction with SPAMM-labelled imaging to effectively provide another "dimension" in the image into which to encode a component of heart wall motion. However, as with other MRI studies of motion using phase shifts, the possibility of phase shifts arising from sources other than motion will generally require making another image for use as a phase reference, with an identical technique being used in accordance with the invention except for different phase-shift motion sensitization techniques of the type described by Nayler et al. in an article entitled "Blood Flow Imaging by Cine Magnetic Resonance", *Journal of Computer Assisted Tomography*, Vol. 10, 1986, pp. 715-722. When analyzing such phase-sensitized images in accordance with the invention, the through-plane motion will be initially available as velocity. Integration may then be used so that the through-plane motion may be given as a displacement in a manner consistent with the in-plane motion results.

Figure 5:
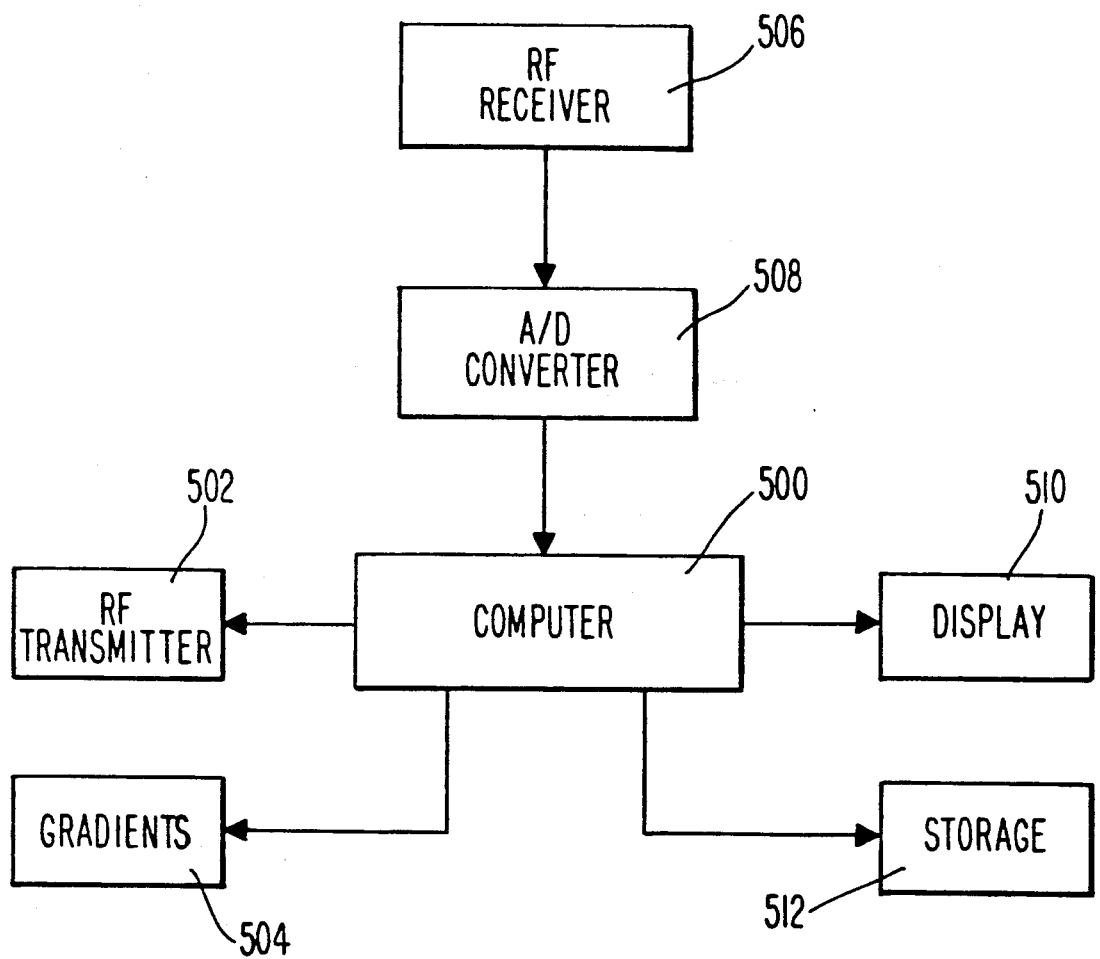
FIG. 5 is a schematic diagram of a magnetic resonance imaging system in accordance with an embodiment of the invention whereby the three-dimensional displacement determination is performed by a computer driven process.

The SPAMM sequencing for allowing the three-dimensional image to be formed as described above may be implemented on a conventional MR imaging system such as the Signa 1.5T MR commercial clinical MR imaging system available from General Electrical Medical Systems A simplified schematic diagram of such an MR imaging system is shown in FIG. 5. As shown in FIG. 5, the MR imaging system is controlled by a central computer 500 and comprises a radio frequency (RF) transmitter 502 and a magnetic field gradient pulse generator 504 which respectively produce RF and magnetic gradient pulse sequences for producing the desired pre-imaging and imaging excitations and manipulations of the magnetization of an object, such as the heart wall, which is to be analyzed. The resulting MR signals from the object are detected by RF receiver 506, and the detected MR signals are converted into digital form by A/D converter 508 before being input into central computer 500. Central computer 500 then reconstructs the images from the received data and manipulates this data for display on display device 510 and/or storage in storage device 512 for later retrieval.

Hence, the apparatus of FIG. 5 may be used to implement the pre-imaging SPAMM sequences described in the afore-mentioned related patent applications. In a preferred embodiment the SPAMM pulses may be integrated into a conventional cardiac-synchronized imaging sequence, where the SPAMM sequence can be started with a trigger pulse derived from the electrocardiogram. The three-dimensional grid of stripes in the imaging plane can then be produced with two 1-4-6-4-1 RF pulse sequences, for example, along with gradient pulses. On the other hand, a simple 1-1 RF pulse sequence may also be used. By acquiring images at a given level at different delay times after the cardiac-derived trigger pulse, the progressive deformation of the heart can be followed through the heart cycle in accordance with the invention. Although the finite relaxation time of heart muscle will result in fading of the stripe pattern, later phases of the cardiac cycle can be studied by increasing the delay time between the R wave and the application of the SPAMM sequence.

For example, both of the three-dimensional SPAMM techniques described above may be implemented on a Signa 1.5T commercial clinical MR imaging system whereby the SPAMM tagging planes are created using binomial sequences such as 1-4-6-4-1. The three-dimensional SPAMM may then be implemented both in conventional cardiac-gated spin echo imaging pulse sequences and in retrospectively gated rapid gradient echo imaging (cine). The phase-shift three-dimensional SPAMM technique described above, on the other hand, may be implemented in a modified cine sequence of the type described by Pelc et al. in an article entitled "Phase Contrast Cine MRI", *Book of Abstracts of the Society of Magnetic Resonance in Medicine*, Eighth Annual Meeting, Aug. 12-18, 1989, p. 101. The appropriate SPAMM spacing may then be adapted to the size of the imaging field of view. For example, 7 mm spacing is typically used for a 24 cm field of view. The phase-shift SPAMM sensitivity also may be typically set to produce a $+/-180°$ phase shift with 9 cm/sec through-plane motion. A representative set of images acquired with such a three-dimensional SPAMM technique in accordance with the invention is shown in FIG. 6, while a corresponding set of images acquired with a phase-shift SPAMM technique in accordance with the second embodiment of the invention is shown in FIG. 7.

Figure 6:
FIG. 6 illustrates a composite set of transverse images of a normal subject acquired with three-dimensional SPAMM at equal-spaced times in the heart cycle from 13 msec after R-wave detection (upper left) to 259 msec after R-wave detection (lower right).

FIG. 6 illustrates a composite set of transverse images of a normal subject acquired with a three-dimensional SPAMM system at equal-spaced times in the heart cycle from 13 msec after R-wave detection (upper left) to 259 msec after R-wave detection (lower right). The diagonal stripes shown in FIG. 6 are produced by orthogonal SPAMM planes spaced approximately 8 mm apart while the vertical stripes are produced by a similar set of SPAMM planes inclined at 45° to the imaging plane. In FIG. 6, the oblique stripes move oppositely at the base (the subject's right illustrated as "B") and at the apex (the subject's left illustrated as "A") relative to the orthogonal stripes, reflecting their different directions of motion relative to the imaging plane.

Figure 7:
FIG. 7 illustrates a corresponding set of transverse images of the same subject as in FIG. 6 acquired with phase-shift SPAMM in accordance with the invention.

FIG. 7, on the other hand, illustrates a corresponding set of transverse images of the same subject as in FIG. 6 except that phase-shift SPAMM is used for determining the through-plane motion in accordance with the second embodiment of the invention. The upper image shows the magnitude while the lower image shows a corresponding phase, with the middle gray area representing no through-plane motion and the brighter gray areas showing motion into the plane. The darker gray represents motion out of the plane, and low magnitude areas are masked out to be black. Differences in the directions of the through-plane motion of the basal and apical regions are reflected in FIG. 7 in the different corresponding phase shifts.

Because of the higher dimensionality of three-dimensional data and the resulting variables characterizing the motion, it is more difficult to display such data in a readily analyzable form. Possibilities for such 3-dimensional display include stereo or interactively rotatable displays such as wire frame displays or shaded surface displays of the heart reflecting the underlying motion variables, and interactive "cutaway" displays of the heart wall. Of course, other display techniques in accordance with the invention may be used as will become apparent to those skilled in the art.

Both the three-dimensional SPAMM and the phase-shift SPAMM MRI methods described herein can usefully incorporate three dimensions of motion information into two-dimensional images. However, there are several factors which one skilled in the art must consider (such as imaging time, temporal and spatial resolution, precision and ease of analysis) when comparing the merits of these techniques relative to each other and to other approaches to MRI of three-dimensional heart wall motion such as use of two different orthogonal sets of images or the use of phase sensitization for all three directions of motion. The three-dimensional SPAMM imaging technique described above is a preferred embodiment of the invention since it is the most efficient in its use of imaging time, for the three-dimensional motion information can be directly obtained from one set of two-dimensional images. The use of the phase-shift SPAMM or of two sets of orthogonal images to find the three-dimensional motion will generally require twice as much imaging time as direct three-dimensional SPAMM MRI due to the additional time required to acquire either the phase reference images or the orthogonal set of images. Alternatively, if the phase reference image data are acquired in an interleaved manner with the phase-sensitized image data using, for example, rapid excitation imaging techniques, the total acquisition time may be kept the same but the temporal resolution will be reduced by a factor of two. When using phase sensitization to record all three dimensions of motion, on the other hand, only one direction of motion can be imaged at a time. This will result in the need for at least another factor of two increase in imaging time, due to the need for three sets of orthogonally phase-sensitized images plus at least one phase reference image.

The spatial resolution of motion information derived from the SPAMM stripes is primarily determined by the spacing of the stripes. In the case of the use of oblique tagging regions as herein described, this is the spacing of their intersections with the image plane, which is preferably greater than the minimum spacing of the tagging regions themselves. By contrast, the spatial resolution of the motion information derived from phase sensitization is, in principle, determined by the image resolution and ultimately the pixel size. However, in practice, signal-to-noise ratio limitations may require averaging phase data from adjacent pixels, thereby reducing the effective spatial resolution. In addition, in principle the precision of motion (i.e., displacement) information derived from images of SPAMM stripe motion is limited by the pixel size, although the use of neighborhood information and interpolated images can permit estimation of stripe displacement to a fraction of a pixel. By contrast, the precision of motion (i.e., velocity) information derived from phase-sensitized images is limited only by the precision of the signal phase calculation, although the signal-to-noise ratio and other sources of phase variation may restrict its accuracy.

The approach to motion analysis to be employed will likely be different for each kind of three-dimensional motion imaging. The images produced with three-dimensional SPAMM as herein described are "busy", with many intersecting stripes superimposed on and partially obscuring the underlying anatomy, making simple visual inspection of the images more difficult. The two-stage approach required for motion analysis of the three-dimensional SPAMM images, whereby in-plane motion is determined from the orthogonal tags and then through-plane motion is determined from the motion of the oblique tags relative to the orthogonal tags, renders both simple qualitative (visual) and quantitative motion analysis somewhat indirect. With phase-shift SPAMM, on the other hand, the motion analysis is again in two stages, with in-plane motion being determined from the magnitude images of the displacement of the tags and through-plane motion being determined from the phase images of the local phase shifts; however, the separation of the motion data into two distinct kinds of images simplifies the analysis, especially visual qualitative analysis. With the use of orthogonal sets of SPAMM images, on the other hand, the use of simple visual qualitative motion analysis is fairly straightforward, but the two-dimensional motion data from the two orthogonal image sets must be interpolated onto a common three-dimensional frame to recover the full three-dimensional motion information. However, the relatively coarse spatial sampling provided by SPAMM is a disadvantage for such an arrangement. Motion analysis from direct phase sensitization to all three spatial dimensions is the most straightforward technique as it can, in principle, directly provide the three-dimensional vector of velocity at each pixel. Given these technological limitations, one skilled in the art may freely choose the desired analysis techniques in accordance with the requirements of the imaging system.

Thus, the use of SPAMM tagging, either separately or in conjunction with phase sensitization to motion in accordance with the invention, can be used to image three-dimensional heart wall motion. However, as would be apparent to one skilled in the art, the techniques herein described may also be used for magnetic resonance imaging of a patient's blood, cerebrospinal fluid and the like. In addition, by using the techniques of the invention, an infarct can be localized and identified and then displayed on a display monitor for analysis by a diagnostician. Furthermore, not only may the technique of the invention be used to separately image motion within the heart wall, but also the invention may be generally used to image elastic strain deformation in all soft tissue structures.

A limitation of the technique in accordance with the invention is that the spatial sampling is limited by the stripe spacing, which is, in turn, limited by the imaging resolution. The duration of the stripe persistence is thus limited both by longitudinal relaxation of the tissue and blurring caused by respiratory motion. The spacing of the stripes can be easily adjusted by changing the strength and duration of the gradient pulse in the pre-imaging sequence. By so adjusting the gradient pulse, stripes as fine as tens of microns apart have been created, thereby enabling very small motions involved in diffusion and perfusion to be monitored.

Although an exemplary embodiment of this invention has been described in detail above, those skilled in the art will readily appreciate that many additional modifications are possible in the exemplary embodiment without materially departing from the novel teachings and advantages of this invention. Accordingly, all such modifications are intended to be included within the scope of this invention as defined in the following claims.

We claim:

1. A method of magnetic resonance imaging of a body portion of a patient, comprising the steps of:
   applying to the body portion an external magnetic field so as to produce a resultant magnetization;
   applying a pre-imaging sequence to the body portion so as to spatially modulate transverse and longitudinal components of the resultant magnetization, thereby producing a spatial modulation pattern in an imaging plane;
   applying an imaging sequence to the body portion;
   providing an image representing magnetic resonance signals having said spatial modulation pattern and a displacement of said modulation pattern through said imaging plane as emitted from the patient; and
   determining said displacement of said modulation pattern through said imaging plane in a direction substantially perpendicular to said imaging plane during a pre-imaging time interval between the times of application of said pre-imaging and imaging sequences.

2. A method as in claim 1, wherein said body portion is the patient's heart wall.

3. A method as in claim 1, wherein said body portion is the patient's blood.

4. A method as in claim 1, wherein said body portion is the patient's cerebrospinal fluid.

5. A method as in claim 1, wherein said pre-imaging sequence applying step comprises the step of modulating said resultant magnetization to produce oblique magnetization lines in the body portion which are oriented at an oblique angle to said imaging plane, and said determining step comprises the step of determining a displacement of said oblique magnetization lines relative to a displacement of said spatial modulation pattern in said imaging plane during said pre-imaging time interval, said relative displacement indicating a displacement of said body portion through said imaging plane during said pre-imaging time interval.

6. A method as in claim 5, wherein said oblique angle is 45°.

7. A method as in claim 1, wherein said pre-imaging sequence applying step comprises the step of encoding motion through said imaging plane during said pre-imaging time interval as motion-induced phase shifts caused by motion of excited nuclear spins along gradients of said resultant magnetization, thereby producing a phase-sensitized modulation pattern in said imaging plane, and said determining step comprises the step of integrating said phase-sensitized modulation pattern to get a signal indicative of a displacement of said body portion through said imaging plane during said pre-imaging time interval.

8. A method of magnetic resonance imaging a heart wall of a patient for detecting motion of said heart wall, comprising the steps of:
   applying to the heart wall an external magnetic field so as to produce a resultant magnetization;
   applying a pre-imaging sequence to the heart wall so as to spatially modulate transverse and longitudinal components of the resultant magnetization, thereby producing a spatial modulation pattern in an imaging plane;
   applying a cardiac gated spin echo imaging sequence to the heart wall;
   providing an image representing magnetic resonance signals having said spatial modulation pattern and a displacement of said modulation pattern through said imaging plane as emitted from the patient; and
   determining said displacement of said modulation pattern through said imaging plane in a direction substantially perpendicular to said imaging plane during a pre-imaging time interval between the times of application of said pre-imaging and imaging sequences.

9. An apparatus for magnetic resonance imaging a body portion of a patient, comprising:
   means for applying to the body portion an external magnetic field so as to produce a resultant magnetization;
   imaging means for applying a pre-imaging sequence to the body portion so as to spatially modulate transverse and longitudinal components of the resultant magnetization, thereby producing a spatial modulation pattern in an imaging plane, and for applying an imaging sequence to the body portion; and
   means for displaying an image representing magnetic resonance signals having said spatial modulation pattern and a displacement of said modulation pattern through said imaging plane as emitted from the patient and for determining said displacement of said modulation pattern through said imaging plane in a direction substantially perpendicular to said imaging plane during a pre-imaging time interval between the times of application of said pre-imaging and imaging sequences.

10. The apparatus of claim 9, wherein said magnetic field applying means and imaging means are adapted so as to apply said magnetic field and pre-imaging sequence to the patient's heart wall.

11. The apparatus of claim 9, wherein said magnetic field applying means and imaging means are adapted so as to apply said magnetic field and pre-imaging sequence to the patient's blood.

12. The apparatus of claim 9, wherein said magnetic field applying means and imaging means are adapted so as to apply said magnetic field and pre-imaging sequence to the patient's cerebrospinal fluid.

13. The apparatus of claim 9, wherein said imaging means comprises means for modulating said resultant magnetization to produce oblique magnetization lines in the body portion which are oriented at an oblique angle to said imaging plane, and said determining means comprises means for determining a displacement of said oblique magnetization lines relative to a displacement of said spatial modulation pattern in said imaging plane during said pre-imaging time interval, said relative displacement indicating a displacement of said body portion through said imaging plane during said pre-imaging time interval.

14. The apparatus of claim 13, wherein said oblique angle is 45°.

15. The apparatus of claim 9, wherein said imaging means comprises means for encoding motion through said imaging plane during said pre-imaging time interval as motion-induced phase shifts caused by motion of excited nuclear spins along gradients of said resultant magnetization, thereby producing a phase-sensitized modulation pattern in said imaging plane, and said determining means comprises means for integrating said phase-sensitized modulation pattern to get a signal indicative of a displacement of said body portion through said imaging plane during said pre-imaging time interval.

16. An apparatus for magnetic resonance imaging a heart wall of a patient for detecting motion of said heart wall, comprising:

means for applying to the heart wall and external magnetic field so as to produce a resultant magnetization;

imaging means for applying a pre-imaging sequence to the heart wall so as to spatially modulate transverse and longitudinal components of the resultant magnetization, thereby producing a spatial modulation pattern in an imaging plane, and for applying a cardiac gated spin echo imaging sequence to the heart wall; and means for displaying an image representing magnetic resonance signals having said spatial modulation pattern and a displacement of said modulation pattern through said imaging plane as emitted from the patient and determining said displacement of said modulation pattern through said imaging plane in a direction substantially perpendicular to said imaging plane during a pre-imaging time interval between the times of application of said pre-imaging and imaging sequences.

* * * * *